(12) United States Patent
Gabbey

(10) Patent No.: US 12,241,916 B2
(45) Date of Patent: Mar. 4, 2025

(54) TEST DEVICE

(71) Applicant: Snap-on Incorporated, Kenosha, WI (US)

(72) Inventor: Nicholas A. Gabbey, Mount Pleasant, WI (US)

(73) Assignee: Snap-on Incorporated, Kenosha, WI (US)

( * ) Notice: Subject to any disclaimer, the term of this patent is extended or adjusted under 35 U.S.C. 154(b) by 0 days.

(21) Appl. No.: 17/875,371

(22) Filed: Jul. 27, 2022

(65) Prior Publication Data

US 2024/0036085 A1   Feb. 1, 2024

(51) Int. Cl.
   *G01R 19/00* (2006.01)

(52) U.S. Cl.
   CPC .................. *G01R 19/0084* (2013.01)

(58) Field of Classification Search
   CPC ............ G01R 19/0084; G01R 1/06788; G01R 31/52; G01R 31/54; G01R 31/006; G01R 31/50
   See application file for complete search history.

(56) References Cited

U.S. PATENT DOCUMENTS

| | | | |
|---|---|---|---|
| 4,002,972 A | 1/1977 | Konrad et al. | |
| 4,027,236 A | 5/1977 | Stewart | |
| 4,207,517 A | 6/1980 | Bloxam | |
| 4,215,306 A * | 7/1980 | Mace | F02P 17/00 324/555 |
| 5,367,250 A | 11/1994 | Whisenand | |
| 5,583,447 A | 12/1996 | Dascher | |
| 5,673,028 A | 9/1997 | Levy | |
| 5,996,102 A | 11/1999 | Haulin | |
| 6,075,448 A | 6/2000 | Verkhovskiy | |
| 6,201,320 B1 | 3/2001 | Gallavan | |
| 6,617,841 B2 | 9/2003 | Thao | |
| 6,829,547 B2 | 12/2004 | Law et al. | |
| 6,859,031 B2 | 2/2005 | Pakdaman et al. | |
| 6,888,341 B2 | 5/2005 | Johnson et al. | |

(Continued)

OTHER PUBLICATIONS

"Vehicle Super Probe KM50, Owner's Manual & Safety Instruction", KZYEE, first available Jul. 2020 at https://www.amazon.com/KZYEE-Automotive-Resistance-Injector-Multimeter/dp/B08CDF1SPJ?th=1 (Year: 2020).*

(Continued)

*Primary Examiner* — Daniel R Miller
(74) *Attorney, Agent, or Firm* — McDonnell Boehnen Hulbert & Berghoff LLP

(57) ABSTRACT

A test device includes a power source having a first connection point and a second connection point, a first voltmeter having a first input and a second input, a second voltmeter having a first input and a second input, a first port, a second port, a third port, and a user interface. The first port is coupled to the first connection point of the power source and to the first input of the first voltmeter, the second port is coupled to the second input of the first voltmeter, the first input of the second voltmeter, and the second connection point of the power source, and the third port is coupled to the second input of the second voltmeter. The user interface is configured to show a first voltage between the first port and the second port and a second voltage between the third port and the second port.

21 Claims, 5 Drawing Sheets

(56) References Cited

U.S. PATENT DOCUMENTS

| | | | |
|---|---|---|---|
| 6,927,078 | B2 | 8/2005 | Saijyo et al. |
| 7,058,865 | B2 | 6/2006 | Mori et al. |
| 7,184,899 | B2 | 2/2007 | Cruz |
| 7,521,947 | B2 | 4/2009 | Rogers et al. |
| 7,629,796 | B2 | 12/2009 | Eun et al. |
| 7,728,601 | B2 | 6/2010 | Yamasaki et al. |
| 7,768,292 | B1 | 8/2010 | Koch |
| 8,736,292 | B2 | 5/2014 | Ishigaki et al. |
| 8,988,098 | B2 | 3/2015 | Partee |
| 9,063,191 | B2 * | 6/2015 | Whisenand .......... G01R 31/005 |
| 9,140,752 | B2 | 9/2015 | Oshima |
| D753,002 | S | 4/2016 | Russell |
| 9,400,314 | B2 | 7/2016 | Humphrey et al. |
| 9,513,320 | B2 | 12/2016 | Whisenand et al. |
| 9,753,095 | B2 | 9/2017 | Partee |
| 9,759,783 | B2 | 9/2017 | Partee |
| 9,766,269 | B2 | 9/2017 | Russell |
| 10,024,902 | B2 | 7/2018 | Cabot et al. |
| 10,048,306 | B1 | 8/2018 | Darbha et al. |
| 10,060,981 | B2 | 8/2018 | Barden et al. |
| D830,866 | S | 10/2018 | Brekke et al. |
| 10,330,740 | B2 | 6/2019 | Partee |
| D861,717 | S | 10/2019 | Brekke et al. |
| 10,509,063 | B2 | 12/2019 | Steuer |
| 10,634,731 | B2 | 4/2020 | Partee |
| 10,782,350 | B2 | 9/2020 | Huh et al. |
| 10,837,994 | B2 | 11/2020 | Whisenand et al. |
| D904,439 | S | 12/2020 | Wu et al. |
| 11,002,796 | B2 | 5/2021 | Cabot et al. |
| 11,016,148 | B1 | 5/2021 | Curtis |
| 2003/0128036 | A1 | 7/2003 | Henningson et al. |
| 2005/0025883 | A1 | 2/2005 | Yuan et al. |
| 2005/0031944 | A1 | 2/2005 | Sodemann et al. |
| 2005/0052186 | A1 | 3/2005 | Grube |
| 2005/0200346 | A1 | 9/2005 | Novak et al. |
| 2005/0258835 | A1 | 11/2005 | Saijyo |
| 2006/0145714 | A1 * | 7/2006 | Cruz .................... G01R 15/125 324/754.03 |
| 2009/0009304 | A1 | 1/2009 | Lacasse |
| 2010/0201191 | A1 * | 8/2010 | Schick .................... B60R 16/03 307/10.1 |
| 2010/0225343 | A1 | 9/2010 | Kuono |
| 2016/0161560 | A1 * | 6/2016 | Barden ............. G01R 31/3278 324/415 |
| 2016/0193926 | A1 | 7/2016 | Abraham et al. |
| 2019/0049509 | A1 * | 2/2019 | Warmack ............... G01R 31/52 |
| 2019/0383868 | A1 | 12/2019 | Russell et al. |
| 2021/0173016 | A1 | 6/2021 | Whisenand et al. |
| 2021/0231734 | A1 | 7/2021 | Cabot et al. |

OTHER PUBLICATIONS

"Multimeter", Multimeter, first available Jan. 2022 at http://web.archive.org/web/20220111200412/https://en.wikipedia.org/wiki/Multimeter (Year: 2022).*

"Sparking 10FT 12V Battery Alligator Clip to SAE 2Pin Quick Disconnect Cable SAE to Battery Clamp-On Cable 15A Fuse", available on amazon since Apr. 3, 2019 (Year: 2019).*

Berger et al., "Optical Signal Injection for High-speed Wafer Level Function Test of Integrated Circuits", https://dl.asminternational.org/istfa/proceedings-abstract/ISTFA1996/30811/263/8585 (1996).

Hemenway et al., "Optical Detection of Charge Modulation in Si Integrated Circuits Using a Multimode Laser-Diode Probe", https://ieeexplore.ieee.org/abstract/document/1487204 (1987).

Berger HH et al, "Contactless Function Test of Integrated Circuits on the Wafer", https://dl.asminternational.org/istfa/proceedings-abstract/ISTFA1996/30811/263/8585 only abstract available (1996).

* cited by examiner

TEST DEVICE

BACKGROUND

Circuit troubleshooting can be difficult in modern automotive vehicles because many circuits, such as window switches, trunk release switches, and headlight switches, are controlled by computers instead of user-operated analog contact switches. In some situations, a computer detects a problem with a circuit and responsively disables that circuit by disconnecting the power and/or the ground from the circuit. Diagnosing an unpowered circuit can be difficult because there is generally no voltage to trace throughout the circuit.

Overview

One aspect of the disclosure is a test device comprising: a power source having a first connection point and a second connection point, a first voltmeter having a first input and a second input, a second voltmeter having a first input and a second input, a first port, a second port, a third port, and a user interface, wherein: the first port is operatively coupled to the first connection point of the power source and to the first input of the first voltmeter, the second port is operatively coupled to the second input of the first voltmeter, the first input of the second voltmeter, and the second connection point of the power source, the third port is operatively coupled to the second input of the second voltmeter, and the user interface is configured to show a first voltage between the first port and the second port and a second voltage between the third port and the second port.

In an embodiment of the test device, the power source includes a battery.

In an embodiment of the test device, the first connection point is a positive terminal of the battery and the second connection point is a negative terminal of the battery.

In an embodiment of the test device, the battery is rechargeable.

In an embodiment of the test device, the test device also includes a switch, wherein the first port is operatively coupled to the first connection point of the power source and to the first input of the first voltmeter when the switch is in a first position, and the first port is disconnected from the first connection point of the power source and from the first input of the first voltmeter when the switch is in a second position.

In an embodiment of the test device, a voltage potential between the first connection point and the second connection point is applied between the first port and the second port when the switch is in the first position.

In an embodiment of the test device, the test device also includes a circuit protector.

In an embodiment of the test device, the circuit protector comprises a fuse or a circuit breaker.

In an embodiment of the test device, the test device also includes a first connection lead including a first proximal end and a first distal end, a second connection lead including a second proximal end and a second distal end, and a third connection lead including a third proximal end and a third distal end, wherein: the first proximal end is connected to the first port, the second proximal end is connected to the second port, and the third proximal end is connected to the third port.

In an embodiment of the test device, one or more of the first proximal end, the second proximal end, or the third proximal end is fixedly connected to the first port, the second port, or the third port, respectively.

In an embodiment of the test device, one or more of the first proximal end, the second proximal end, or the third proximal end is removably connected to the first port, the second port, or the third port, respectively.

In an embodiment of the test device, the test device also includes a housing that contains the power source, the first voltmeter, and the second voltmeter.

In an embodiment of the test device, the first voltmeter is configured to provide the first voltage with at least three significant digits.

In an embodiment of the test device, the second voltmeter is configured to provide the second voltage with at least three significant digits.

In an embodiment of the test device, the user interface is configured to show the first voltage simultaneously with display of the second voltage.

In an embodiment of the test device, the test device also includes a first actuator operable to adjust the first voltage, or a second actuator operable to adjust a maximum current that can flow through the first port.

In an embodiment of the test device, the test device also includes an Ohmmeter configured to detect and display a resistance of a circuit under test (e.g., a resistance between the second port and the third port).

In an embodiment of the test device, the test device also includes an ammeter configured to detect and display a magnitude and a polarity of a current passing through a circuit under test (e.g., a current passing through the first port).

Another aspect of the disclosure is a method comprising: providing, via a power source of a test device, a first voltage between a first terminal of a circuit and a second terminal of the circuit, detecting, via a first voltmeter of the test device, the first voltage, detecting, via a second voltmeter of the test device, a second voltage between a third terminal of the circuit and the second terminal, and displaying, via a user interface of the test device, the first voltage based on a first output of the first voltmeter and the second voltage based on a second output of the second voltmeter.

In an embodiment of the method, providing and detecting the first voltage comprises providing and detecting the first voltage while an electronic control module is isolating the circuit from a second power source, and wherein detecting the second voltage comprises detecting the second voltage while the electronic control module is isolating the circuit from the second power source.

In an embodiment of the method, the method also includes detecting, via the second voltmeter, a third voltage between a fourth terminal of the circuit and the second terminal, and displaying, via the user interface, the third voltage based on an output of the second voltmeter.

Another aspect of the disclosure is a non-transitory computer readable medium storing instructions that, when executed by a test device, cause the test device to perform functions comprising: providing, via a power source of the test device, a first voltage between a first terminal of a circuit and a second terminal of the circuit, detecting, via a first voltmeter of the test device, the first voltage, detecting, via a second voltmeter of the test device, a second voltage between a third terminal of the circuit and the second terminal, and displaying, via a user interface of the test device, the first voltage based on a first output of the first voltmeter and the second voltage based on a second output of the second voltmeter.

Other embodiments will become apparent to those of ordinary skill in the art by reading the following detailed description, with reference where appropriate to the accompanying drawings.

BRIEF DESCRIPTION OF THE DRAWINGS

Example embodiments are described herein with reference to the drawings.

DETAILED DESCRIPTION

This description describes several example embodiments, at least some of which pertain to test devices, such as a test device including a power source and two voltmeters. As noted above, a need exists for a test device that can be used to better diagnose an unpowered circuit. Such a test device includes a power source having a first connection point and a second connection point, a first voltmeter having a first input and a second input, and a second voltmeter having a first input and a second input. The test device also includes a first port, a second port, a third port, and a user interface. The first port is operatively coupled to the first connection point of the power source and to the first input of the first voltmeter. The second port is operatively coupled to the second input of the first voltmeter, the first input of the second voltmeter, and the second connection point of the power source. The third port is operatively coupled to the second input of the second voltmeter. The user interface is configured to show a first voltage between the first port and the second port and a second voltage between the third port and the second port.

Thus, the test device performs functions that are useful for diagnosing an unpowered circuit. For example, the test device energizes the circuit by providing a first voltage between a first terminal of the circuit and a second terminal (e.g., ground) of the circuit and detects and displays the first voltage via the first voltmeter and the user interface. Additionally, the test device detects and displays a second voltage between a third terminal of the circuit and the second terminal. In this way, the first port can be used to energize the circuit such that the circuit performs as if the circuit were powered by a computing device, as during normal operating conditions. The second port is used to provide a common ground. Finally, the third port is used to detect (e.g., anomalous) voltages at various terminals of the circuit, which can be used to determine how the circuit is malfunctioning.

Disclosed examples will now be described more fully hereinafter with reference to the accompanying Drawings, in which some, but not all of the disclosed examples are shown. Indeed, several different examples may be described and should not be construed as limited to the examples set forth herein. Rather, these examples are described so that this disclosure will be thorough and complete and will fully convey the scope of the disclosure to those skilled in the art.

I. Example Test Devices

Figure 1:
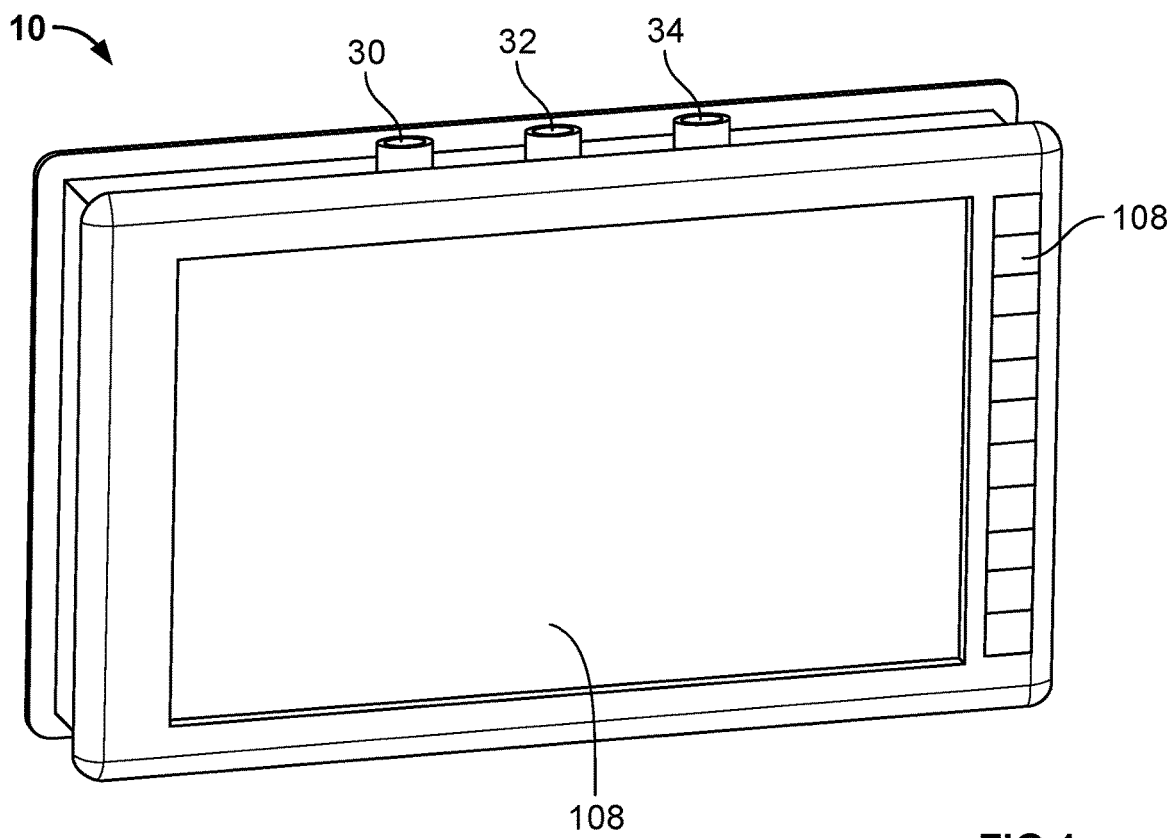
FIG. 1 is a front view of a test device, according to an example embodiment.

FIG. 1 is a front view of a test device 10. The test device 10 includes a user interface 108 in the form of a display screen and several push buttons along a right side of the display. The push buttons can be operated to cause the test device 10 to perform various functions as described below.

The test device 10 also includes a first port 30, a second port 32, and a third port 34 at the top of the test device 10. Connection leads can be connected respectively to the first port 30, the second port 32, and the third port 34 to provide voltages or currents to a circuit under test and/or to detect voltages or currents of the circuit.

Figure 2:
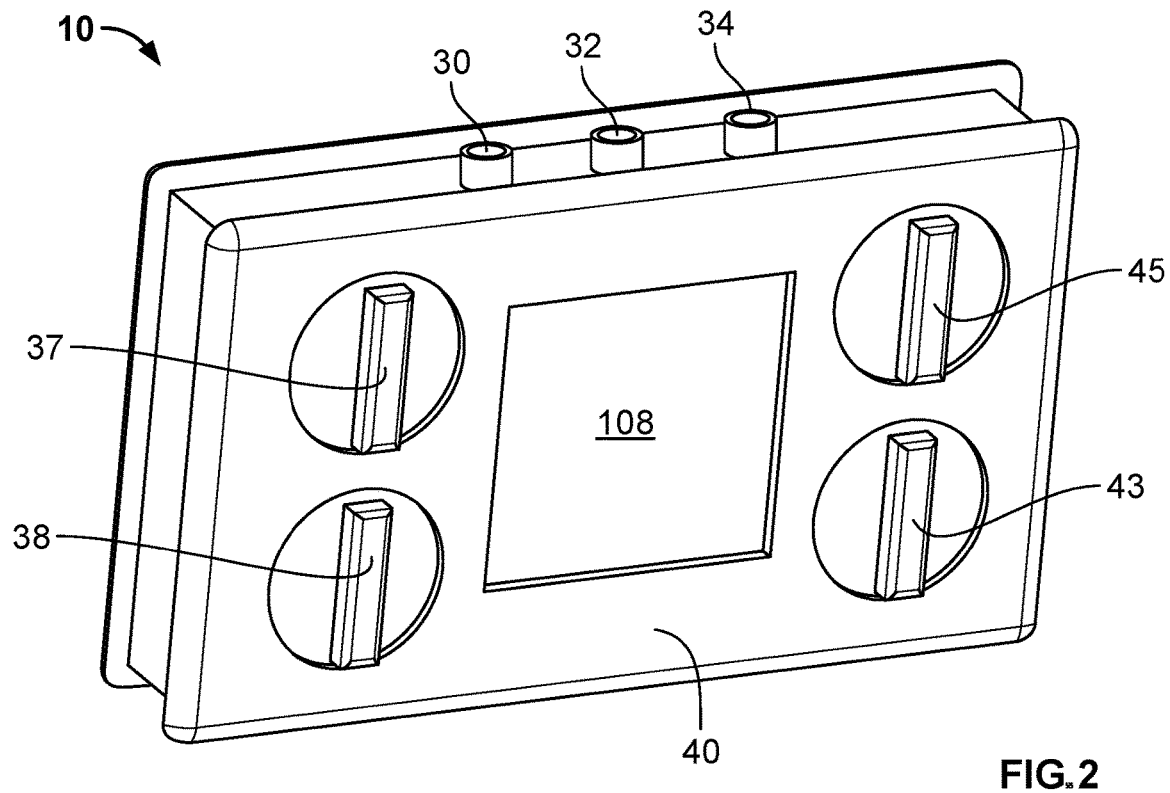
FIG. 2 is a front view of a test device, according to an example embodiment.

FIG. 2 is a front view of another embodiment of the test device 10. As shown, the test device 10 is enclosed in a housing 40 that is made of plastic, for example. The housing 40 contains a power source, a first voltmeter, and a second voltmeter, among other components of the test device 10. The test device 10 also includes a knob 37, a knob 38, a knob 43, and a knob 45, any of which can be used to adjust settings of the test device 10, as described below. The test device 10 further includes the user interface 108 in the form of a display screen.

Figure 3:
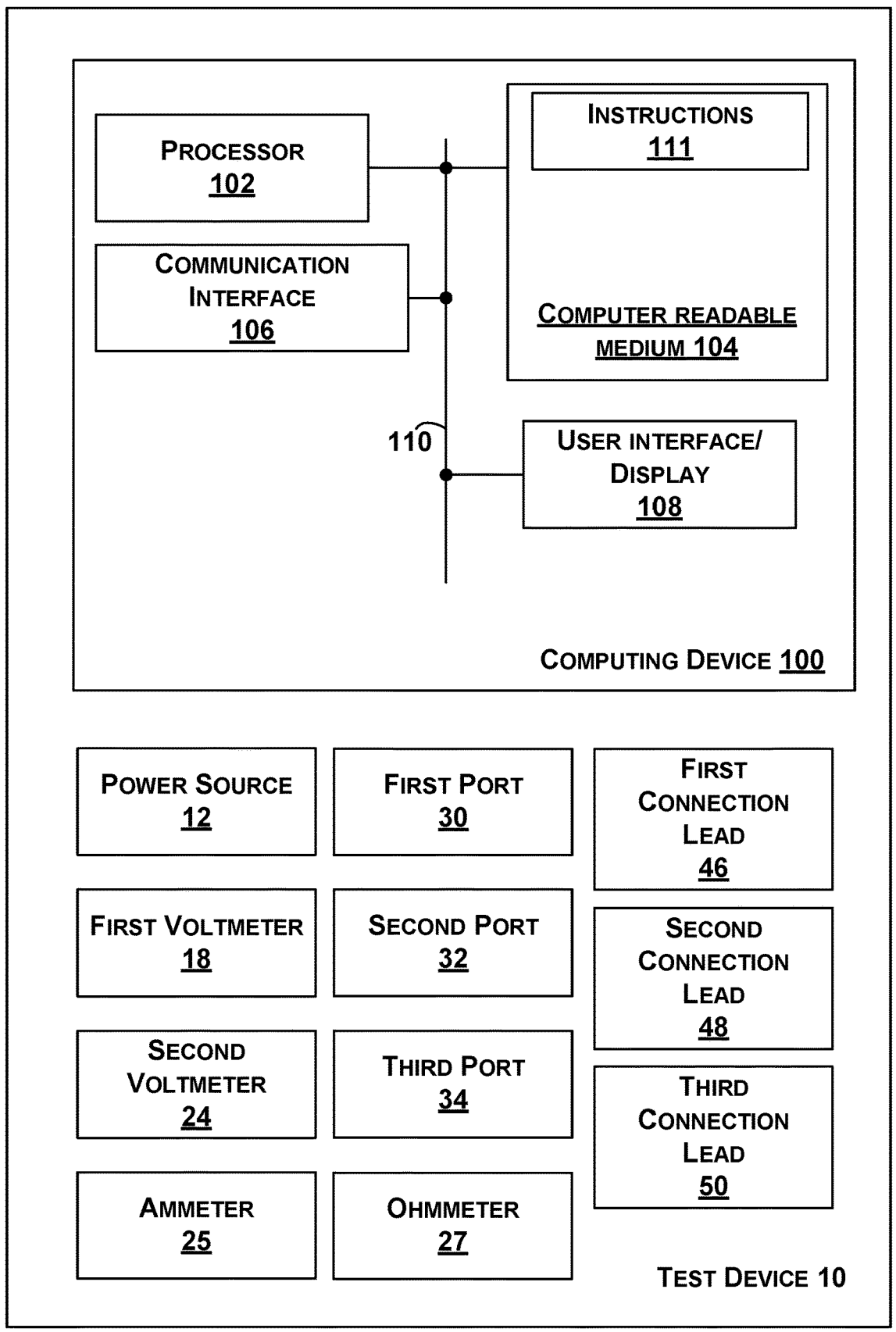
FIG. 3 is a block diagram of a test device, according to an example embodiment.

FIG. 3 is a block diagram of the test device 10. The test device 10 includes a power source 12, a first voltmeter 18, a second voltmeter 24, an ammeter 25, an ohmmeter 27, the first port 30, the second port 32, the third port 34, a first connection lead 46, a second connection lead 48, a third connection lead 50, and a computing device 100.

The computing device 100 includes one or more processors 102, a non-transitory computer readable medium 104, a communication interface 106, and the user interface 108. Components of the computing device 100 are linked together by a system bus, network, or other connection mechanism 110.

The one or more processors 102 can be any type of processor(s), such as a microprocessor, a field programmable gate array, a digital signal processor, a multicore processor, etc., coupled to the non-transitory computer readable medium 104.

The non-transitory computer readable medium 104 can be any type of memory, such as volatile memory like random access memory (RAM), dynamic random access memory (DRAM), static random access memory (SRAM), or non-volatile memory like read-only memory (ROM), flash memory, magnetic or optical disks, or compact-disc read-only memory (CD-ROM), among other devices used to store data or programs on a temporary or permanent basis.

Additionally, the non-transitory computer readable medium 104 can store instructions 111. The instructions 111 are executable by the one or more processors 102 to cause the computing device 100 (e.g., the test device 10) to perform any of the functions or methods described herein.

The communication interface 106 can include hardware to enable communication within the computing device 100 and/or between the computing device 100 and one or more other devices. The hardware can include any type of input and/or output interfaces, a universal serial bus (USB), PCI Express, transmitters, receivers, and antennas, for example. The communication interface 106 can be configured to facilitate communication with one or more other devices, in accordance with one or more wired or wireless communication protocols. For example, the communication interface 106 can be configured to facilitate wireless data communication for the computing device 100 according to one or more wireless communication standards, such as one or more Institute of Electrical and Electronics Engineers (IEEE) 801.11 standards, ZigBee standards, Bluetooth standards, etc. As another example, the communication interface 106 can be configured to facilitate wired data communication with one or more other devices. The communication interface 106 can also include analog-to-digital converters (ADCs) or digital-to-analog converters (DACs) that the computing device 100 can use to control various components of the computing device 100 or external devices.

The user interface 108 can include any type of display component configured to display data. As one example, the user interface 108 can include a touchscreen display. As another example, the user interface 108 can include a flat-panel display, such as a liquid-crystal display (LCD) or a light-emitting diode (LED) display. The user interface 108 can include one or more pieces of hardware used to provide data and control signals to the computing device 100. For instance, the user interface 108 can include a mouse or a pointing device, a keyboard or a keypad, a microphone, a touchpad, or a touchscreen, among other possible types of user input devices. Generally, the user interface 108 can enable an operator to interact with a graphical user interface (GUI) provided by the computing device 100 (e.g., displayed by the user interface 108).

The power source 12 typically takes the form of a rechargeable battery, but other examples are possible.

The first voltmeter 18 is an instrument configured to provide digital or analog output that indicates a voltage detected between inputs of the first voltmeter 18. The first voltmeter 18 generally includes a high resistance between the inputs of the first voltmeter 18 when compared to the circuit under test such that measurement of the voltage does not change the voltage substantially.

Likewise, the second voltmeter 24 is an instrument configured to provide digital or analog output that indicates a voltage detected between inputs of the second voltmeter 24. The second voltmeter 24 generally includes a high resistance between the inputs of the second voltmeter 24 when compared to the circuit under test such that measurement of the voltage does not change the voltage substantially.

By the term "about" or "substantially" with reference to amounts or measurement values described herein, it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

The first port 30 is configured for receiving the first connection lead 46, the second port 32 is configured for receiving the second connection lead 48, and the third port 34 is configured for receiving the third connection lead 50.

Figure 4:
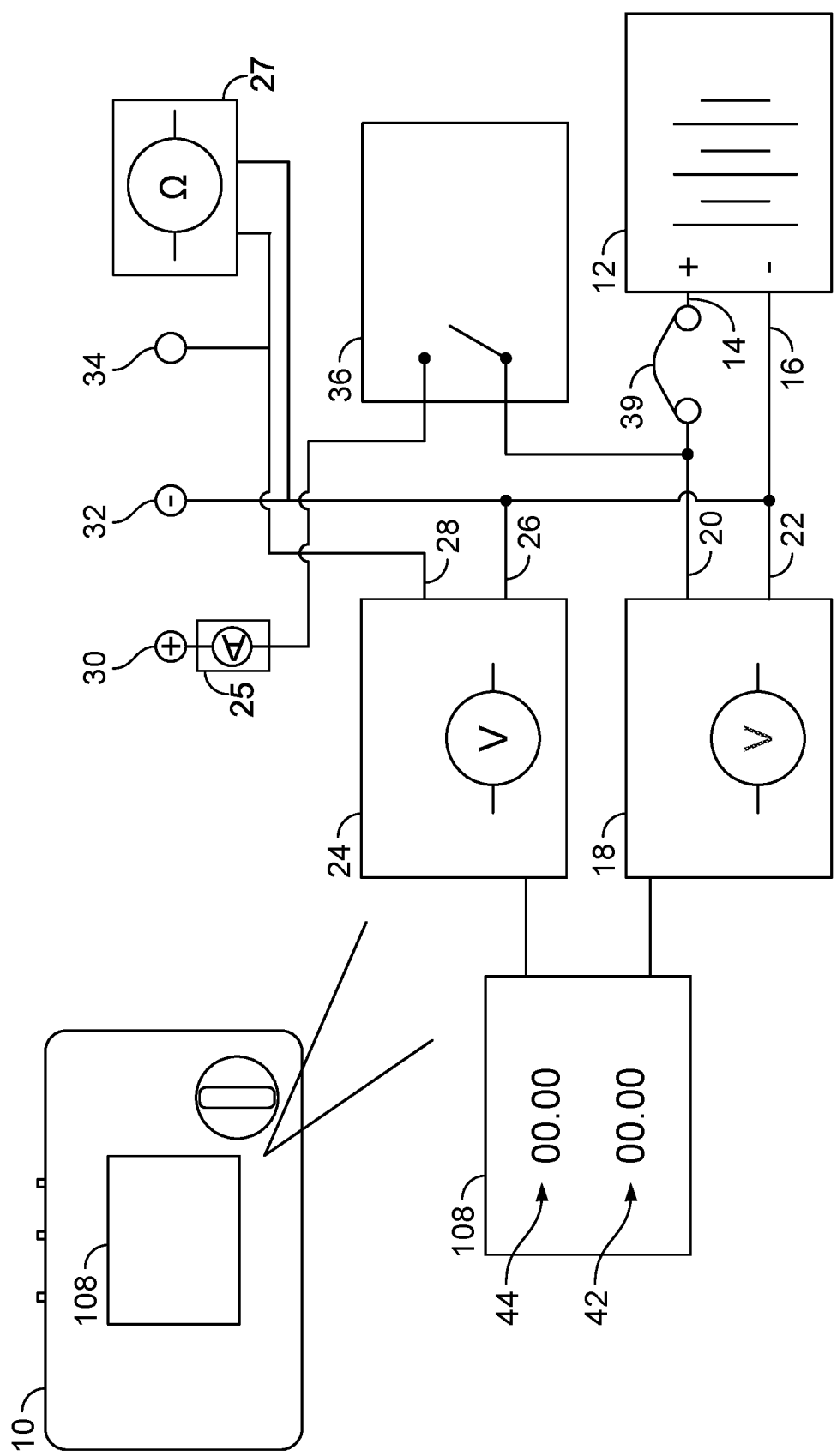
FIG. 4 is a schematic diagram of a test device, according to an example embodiment.

FIG. 4 is a schematic diagram of the test device 10. As shown, the test device 10 includes the power source 12 having a first connection point 14 and a second connection point 16, the first voltmeter 18 having a first input 20 and a second input 22, and the second voltmeter 24 having a first input 26 and a second input 28. The test device 10 also includes the first port 30, the second port 32, the third port 34, and the user interface 108.

The first port 30 is operatively coupled to the first connection point 14 (e.g., a positive terminal) of the power source 12 and to the first input 20 of the first voltmeter 18. More specifically, the first port 30 is operatively coupled to the first connection point 14 via a switch 36 and a circuit protector 39 (e.g., a fuse or a circuit breaker). The first port 30 is operably coupled to the first input 20 via the switch 36. As such, the first port 30 can provide the positive voltage of the power source 12 to a circuit under test to energize the circuit. The first voltmeter 18 is used to monitor and display the voltage of the power source 12.

A user can operate the switch 36 to determine whether the circuit under test is energized by the power source 12. The first port 30 is operatively coupled to the first connection point 14 of the power source 12 and to the first input 20 of the first voltmeter 18 when the switch 36 is in a first position (e.g., closed). The first port 30 is disconnected from the first connection point 14 of the power source 12 and from the first input 20 of the first voltmeter 18 when the switch 36 is in a second position (e.g., open). As such, a voltage potential between the first connection point 14 and the second connection point 16 is applied between the first port 30 and the second port 32 when the switch 36 is in the closed position.

The second port 32 is operatively coupled to the second input 22 of the first voltmeter 18, the first input 26 of the second voltmeter 24, and the second connection point 16 (e.g., a ground or negative terminal) of the power source 12. Thus, the second port 32 establishes a common ground for the power source 12, the first voltmeter 18, the second voltmeter 24, and the circuit under test.

The third port 34 is operatively coupled to the second input 28 of the second voltmeter 24. The third port 34 is configured to monitor voltages at various terminals of the circuit under test as discussed below.

The user interface 108 is configured to show a first voltage 42 between the first port 30 and the second port 32 and a second voltage 44 between the third port 34 and the second port 32. The first voltmeter 18 is configured to provide the first voltage 42 with at least three significant digits of accuracy. Similarly, the second voltmeter 24 is configured to provide the second voltage 44 with at least three significant digits of accuracy. As shown, the user interface 108 is configured to show the first voltage 42 simultaneously with display of the second voltage 44.

In some examples, actuators such as the knob 37, the knob 38, the knob 43, or the knob 45 (shown in FIG. 2) can be used to adjust various settings of the test device 10. For example, the knob 37 (e.g., in conjunction with a voltage divider) can be used to adjust the first voltage 42 provided between the first port 30 and the second port 32. Additionally or alternatively, the knob 38 (e.g., in conjunction with the circuit protector 39) can be used to adjust a maximum current that is allowed to flow through the first port 30. Other examples are possible.

The ammeter 25 is configured to detect and/or display a magnitude and a polarity of a current passing through a circuit under test (e.g., a current passing through the first port 30).

The ohmmeter 27 is configured to detect and display a resistance of a circuit under test (e.g., a resistance between the second port 32 and the third port 34).

Figure 5:
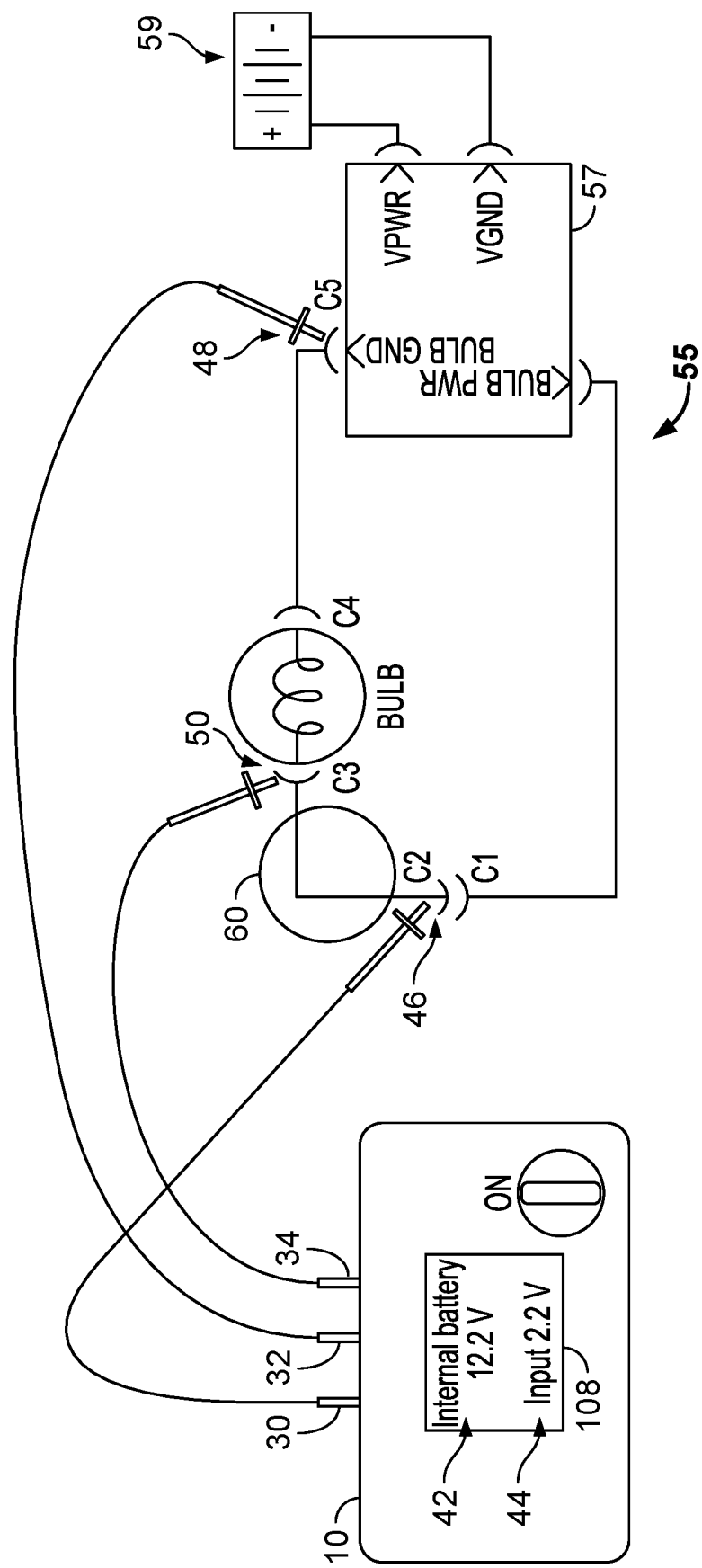
FIG. 5 is a schematic diagram showing a test device being used to diagnose a circuit, according to an example embodiment.

FIG. 5 is a schematic diagram showing the test device 10 being used to diagnose a circuit 55. The electronic control module (ECM) 57 has positive power input from a vehicle battery 59 to VPWR and ground input from the vehicle battery 59 to VGND. The circuit 55 provides the voltage of the vehicle battery 59 at terminals BULB PWR and BULB GND, but if the ECM 57 detects a problem in the circuit 55, the ECM 57 disables the circuit 55 by disconnecting the power and/or ground for the circuit 55. When disconnected, the user can close the switch between the terminal C1 and the terminal C2, but since the circuit 55 is disabled internally by the ECM 57, no voltage will be applied to the circuit 55.

Instead, the test device 10 can be used to apply voltage to the circuit 55 by connecting the first port 30 to the terminal C2 using the first connection lead 46 and by connecting the second port 32 to the terminal C5 via the second connection lead 48. This will power the circuit 55 between the terminal C2 and the terminal C5. As shown, the first voltage 42 applied between the terminal C2 and the terminal C5 is 12.2 volts.

Next, the third connection lead 50 is used to connect the third port 34 to various terminals of the circuit 55 to inspect the circuit 55. For example, the third connection lead 50 is connected to the terminal C3 and the second voltage 44 between the terminal C3 and the terminal C5 is displayed to be 2.2 volts. Since the second voltage 44 is significantly less than the first voltage 42, the defective portion 60 of the circuit 55 is inferred to be between the terminal C2 and the terminal C3. If the wiring was functioning normally between the terminal C2 and the terminal C3, the second voltage 44 would be approximately 12.2 volts, that is, approximately equal to the first voltage 42. Thus, a fault (e.g., corroded wiring) exists between the terminal C2 and the terminal C3. If the wiring between the terminal C2 and the terminal C3 was completely open, the second voltage 44 would be displayed as 0 volts.

As shown, the first connection lead 46 has a proximal end (e.g., fixedly or removably) connected to the first port 30 and a distal end connected to the terminal C2 of the circuit 55. Thus, the positive terminal of the power source 12 is operably connected to the terminal C2.

The second connection lead 48 has a proximal end (e.g., fixedly or removably) connected to the second port 32 and a distal end connected to the terminal C5 of the circuit 55. Thus, the negative/ground terminal of the power source 12 is operably connected to the terminal C5. Accordingly, the user interface 108 displays the first voltage 42 between the terminal C2 and the terminal C5.

The third connection lead 50 has a proximal end (e.g., fixedly or removably) connected to the third port 34 and a distal end connected to the terminal C3 of the circuit 55. Thus, the user interface 108 displays the second voltage 44 between the terminal C3 and the terminal C5. The second voltage 44 will generally vary depending on where the distal end of the third connection lead 50 is placed within the circuit 55.

As such, the test device 10 provides, via the power source 12 of the test device 10, the first voltage 42 between the terminal C2 of the circuit 55 and the terminal C5 of the circuit 55. The test device 10 also detects the first voltage 42 using the first voltmeter 18 of the test device 10 and detects the second voltage 44 between the terminal C3 and the terminal C5 using the second voltmeter 24 of the test device 10. Additionally, the test device 10 displays, via the user interface 108 of the test device 10, the first voltage 42 based on the output of the first voltmeter 18 and the second voltage 44 based on the output of the second voltmeter 24.

As noted above, the test device 10 can provide and detect the first voltage 42 while the ECM 57 is isolating the circuit 55 from a second power source (e.g., the vehicle battery 59). Similarly, the test device 10 can detect the second voltage 44 while the ECM 57 is isolating the circuit 55 from the second power source (e.g., the vehicle battery 59). In this context, isolating the circuit 55 can mean that the ECM 57 operates internal switches such that the terminal VPWR is not connected to the terminal BULB PWR and/or such that the terminal VGND is not connected to the terminal BULB GND.

The test device 10 can be used to detect and display voltages of other terminals of the circuit 55 as well. For example, the distal end of the third connection lead 50 could be moved to the terminal C4 and the second voltage 44 displayed by the user interface 108 would then correspond to the voltage between the terminal C4 and the terminal C5.

Figure 6:
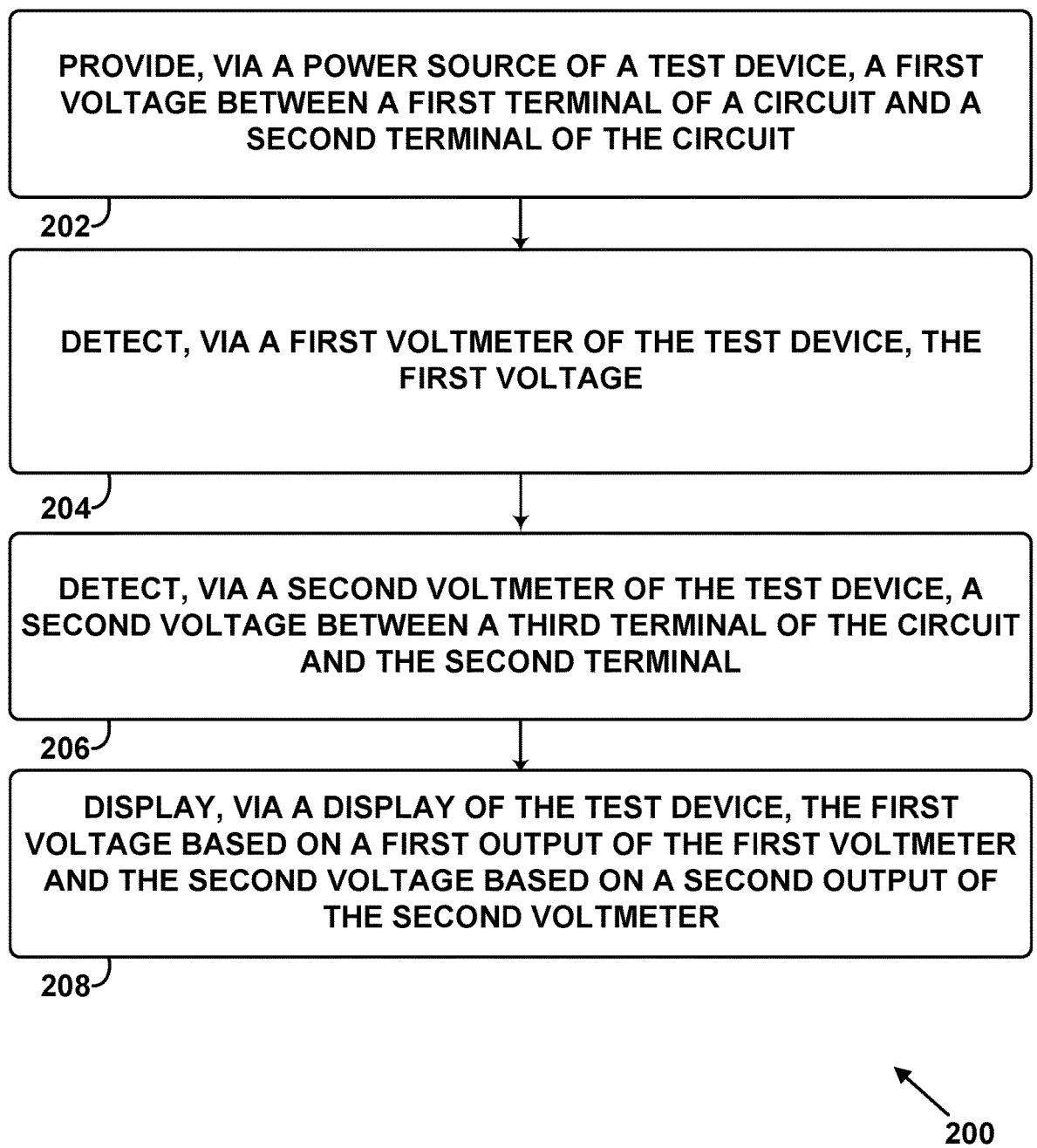
FIG. 6 is a block diagram of a method, according to an example embodiment.

FIG. 6 is a block diagram of a method 200 for operating the test device 10. As shown in FIG. 6, the method 200 includes one or more operations, functions, or actions as illustrated by blocks 202, 204, 206, and 208. Although the blocks are illustrated in a sequential order, these blocks may also be performed in parallel, and/or in a different order than those described herein. Also, the various blocks may be combined into fewer blocks, divided into additional blocks, and/or removed based upon the desired implementation.

At block 202, the method 200 includes the test device 10 providing, via the power source 12 of the test device 10, the first voltage 42 between the terminal C2 of the circuit 55 and the terminal C5 of the circuit 55. Functionality related to block 202 is described above with reference to FIG. 5.

At block 204, the method 200 includes the test device 10 detecting, via the first voltmeter 18 of the test device 10, the first voltage 42. Functionality related to block 204 is described above with reference to FIG. 5.

At block 206, the method 200 includes the test device 10 detecting, via the second voltmeter 24 of the test device 10, the second voltage 44 between the terminal C3 of the circuit 55 and the terminal C5. Functionality related to block 206 is described above with reference to FIG. 5.

At block 208, the method 200 includes the test device 10 displaying, via the user interface 108 of the test device 10, the first voltage 42 based on a first output of the first voltmeter 18 and the second voltage 44 based on a second output of the second voltmeter 24. Functionality related to block 208 is described above with reference to FIG. 5.

II. Conclusion

It should be understood that the arrangements described herein and/or shown in the drawings are for purposes of example only and are not intended to be limiting. As such, those skilled in the art will appreciate that other arrangements and elements (e.g., machines, interfaces, functions, orders, and/or groupings of functions) can be used instead, and some elements can be omitted altogether.

While various aspects and embodiments are described herein, other aspects and embodiments will be apparent to those skilled in the art. The various aspects and embodiments disclosed herein are for purposes of illustration and are not intended to be limiting, with the true scope being indicated by the claims, along with the full scope of equivalents to which such claims are entitled. It is also to be understood that the terminology used herein for the purpose of describing embodiments only, and is not intended to be limiting.

In this description, the articles "a," "an," and "the" are used to introduce elements and/or functions of the example embodiments. The intent of using those articles is that there is one or more of the introduced elements and/or functions.

In this description, the intent of using the term "and/or" within a list of at least two elements or functions and the intent of using the terms "at least one of," "at least one of the following," "one or more of," "one or more from among," and "one or more of the following" immediately preceding a list of at least two components or functions is to cover each embodiment including a listed component or function independently and each embodiment including a combination of the listed components or functions. For example, an embodiment described as including A, B, and/or C, or at least one of A, B, and C, or at least one of: A, B, and C, or at least one of A, B, or C, or at least one of: A, B, or C, or one or more of A, B, and C, or one or more of: A, B, and C, or one or more of A, B, or C, or one or more of: A, B, or C is intended to cover each of the following possible embodiments: (i) an embodiment including A, but not B and not C, (ii) an embodiment including B, but not A and not C, (iii) an embodiment including C, but not A and not B, (iv) an embodiment including A and B, but not C, (v) an embodiment including A and C, but not B, (v) an embodiment including B and C, but not A, and/or (vi) an embodiment including A, B, and C. For the embodiments including component or function A, the embodiments can include one A or multiple A. For the embodiments including component or function B, the embodiments can include one B or multiple B. For the embodiments including component or function C, the embodiments can include one C or multiple C. In accordance with the aforementioned example and at least some of the example embodiments, "A" can represent a component, "B" can represent a system, and "C" can represent a system.

The use of ordinal numbers such as "first," "second," "third" and so on is to distinguish respective elements rather than to denote an order of those elements unless the context of using those terms explicitly indicates otherwise. Further, the description of a "first" element, such as a first plate, does not necessitate the presence of a second or any other element, such as a second plate.

What is claimed is:

1. A test device comprising:
    a power source having a first connection point and a second connection point;
    a first voltmeter having a first input and a second input;
    a second voltmeter having a third input and a fourth input;
    a housing that contains and encloses the power source, the first voltmeter, and the second voltmeter;
    a first port on the housing;
    a second port on the housing;
    a third port on the housing; and
    a user interface, wherein:
        the first port is operatively coupled within the housing to the first connection point of the power source and to the first input of the first voltmeter, wherein the first port is configured to be connected to a first terminal of a circuit that is outside of the housing,
        the second port is operatively coupled within the housing to the second input of the first voltmeter, the third input of the second voltmeter, and the second connection point of the power source, wherein the second port is configured to be connected to a second terminal of the circuit,
        the third port is operatively coupled within the housing to the fourth input of the second voltmeter, wherein the third port is configured to be connected to a third terminal of the circuit, and
        the user interface is configured to show a first voltage between the first port and the second port and a second voltage between the third port and the second port.

2. The test device of claim 1, wherein the power source includes a battery.

3. The test device of claim 2, wherein the first connection point is a positive terminal of the battery and the second connection point is a negative terminal of the battery.

4. The test device of claim 2, wherein the battery is rechargeable.

5. The test device of claim 1, further comprising a switch, wherein the first port is operatively coupled to the first connection point of the power source and to the first input of the first voltmeter when the switch is in a first position, and the first port is disconnected from the first connection point of the power source and from the first input of the first voltmeter when the switch is in a second position.

6. The test device of claim 5, wherein a voltage potential between the first connection point and the second connection point is applied between the first port and the second port when the switch is in the first position.

7. The test device of claim 1, further comprising a circuit protector.

8. The test device of claim 7, wherein the circuit protector comprises a fuse or a circuit breaker.

9. The test device of claim 1, further comprising:
    a first connection lead including a first proximal end and a first distal end;
    a second connection lead including a second proximal end and a second distal end; and
    a third connection lead including a third proximal end and a third distal end, wherein:
        the first proximal end is configured to be connected to the first port and the first distal end is configured to be connected to the first terminal,
        the second proximal end is configured to be connected to the second port and the second distal end is configured to be connected to the second terminal, and
        the third proximal end is configured to be connected to the third port and the third distal end is configured to be connected to the third terminal.

10. The test device of claim 9, wherein one or more of the first proximal end, the second proximal end, or the third proximal end is fixedly connected to the first port, the second port, or the third port, respectively.

11. The test device of claim 9, wherein one or more of the first proximal end, the second proximal end, or the third proximal end is removably connected to the first port, the second port, or the third port, respectively.

12. The test device of claim 1, wherein the first voltmeter is configured to provide the first voltage with at least three significant digits.

13. The test device of claim 1, wherein the second voltmeter is configured to provide the second voltage with at least three significant digits.

14. The test device of claim 1, wherein the user interface is configured to show the first voltage simultaneously with display of the second voltage.

15. The test device of claim 1, further comprising an actuator operable by a user to adjust the first voltage.

16. The test device of claim 1, further comprising an actuator operable by a user to adjust a maximum current that can flow through the first port.

17. A method of using the test device of claim 1, the method comprising:
    providing, via the power source, the first voltage between the first terminal of the circuit that is positioned outside the housing and the second terminal of the circuit,
    detecting, via the first voltmeter of the test device, the first voltage;

detecting, via the second voltmeter of the test device, the second voltage between the third terminal of the circuit and the second terminal; and displaying, via the user interface of the test device, the first voltage based on a first output of the first voltmeter and the second voltage based on a second output of the second voltmeter.

18. The method of claim 17, wherein providing and detecting the first voltage comprises providing and detecting the first voltage while an electronic control module is isolating the circuit from a second power source, and wherein detecting the second voltage comprises detecting the second voltage while the electronic control module is isolating the circuit from the second power source.

19. The method of claim 17, further comprising:
detecting, via the second voltmeter, a third voltage between a fourth terminal of the circuit and the second terminal; and
displaying, via the user interface, the third voltage based on an output of the second voltmeter.

20. The method of claim 17, wherein the power source comprises a battery.

21. A non-transitory computer readable medium storing instructions that, when executed by the test device of claim 1, cause the test device to perform functions comprising:
providing, via the power source, the first voltage between the first terminal of the circuit that is positioned outside the housing and the second terminal of the circuit,
detecting, via the first voltmeter of the test device, the first voltage;
detecting, via the second voltmeter of the test device, the second voltage between the third terminal of the circuit and the second terminal; and
displaying, via the user interface of the test device, the first voltage based on a first output of the first voltmeter and the second voltage based on a second output of the second voltmeter.

* * * * *